(12) United States Patent
Ricart et al.

(10) Patent No.: US 11,463,083 B2
(45) Date of Patent: Oct. 4, 2022

(54) ELECTRICAL SYSTEM

(71) Applicant: Lear Corporation, Southfield, MI (US)

(72) Inventors: Raúl Ricart, Valls (ES); Antoni Ferré Fàbregas, Valls (ES)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 17/060,635

(22) Filed: Oct. 1, 2020

(65) Prior Publication Data

US 2021/0105012 A1    Apr. 8, 2021

Related U.S. Application Data

(60) Provisional application No. 62/910,659, filed on Oct. 4, 2019.

(51) Int. Cl.
*H03K 17/687* (2006.01)
*H03K 17/30* (2006.01)
*H03K 19/0944* (2006.01)

(52) U.S. Cl.
CPC ......... *H03K 17/687* (2013.01); *H03K 17/302* (2013.01); *H03K 19/0944* (2013.01)

(58) Field of Classification Search
CPC . H03K 17/687; H03K 17/302; H03K 19/0944
USPC .......................................................... 327/57
See application file for complete search history.

(56) References Cited

U.S. PATENT DOCUMENTS

| 2,126,143 | A | 8/1938 | McGregor |
|---|---|---|---|
| 2,263,554 | A | 11/1941 | Brach |
| 2,480,622 | A | 8/1949 | Warnock |
| 2,678,082 | A | 5/1954 | Nathan |
| 3,181,102 | A | 4/1965 | Fehr |
| 3,213,403 | A | 10/1965 | Hermann |
| 3,268,848 | A | 8/1966 | Adams |
| 3,603,918 | A | 9/1971 | Woertz |

(Continued)

FOREIGN PATENT DOCUMENTS

| CN | 101142597 A | 3/2008 |
|---|---|---|
| CN | 203190203 U | 9/2013 |

(Continued)

OTHER PUBLICATIONS

Co-Pending U.S. Appl. No. 16/597,187, filed Oct. 9, 2019.

(Continued)

*Primary Examiner* — Tomi Skibinski
(74) *Attorney, Agent, or Firm* — Fishman Stewart PLLC (57) ABSTRACT

An electrical system may include an electrical unit including a power source, a switch assembly electrically connected to the power source, an activation portion electrically connected to the switch assembly, an electrical latch electrically connected to the pulse generator and/or the switch assembly, and/or a controller electrically connected to the switch assembly and the electrical latch. An embodiment of a method of operating the electrical system may include activating the activation portion; activating, via the activation portion, the switch assembly to electrically connect the controller with the power source; latching the switch assembly in an activated state via the electrical latch; and/or unlatching the switch assembly via the controller to electrically disconnect the controller from the power source.

20 Claims, 8 Drawing Sheets

(56) References Cited

U.S. PATENT DOCUMENTS

| | | |
|---|---|---|
| 3,933,403 A | 1/1976 | Rubesamen et al. |
| 3,940,182 A | 2/1976 | Tamura |
| 4,020,769 A | 5/1977 | Keir |
| 4,198,025 A | 4/1980 | Lowe et al. |
| 4,243,248 A | 1/1981 | Scholz et al. |
| 4,282,631 A | 8/1981 | Uehara et al. |
| 4,511,187 A | 4/1985 | Rees |
| 4,575,295 A | 3/1986 | Rebentisch |
| 4,618,808 A | 10/1986 | Ish-Shalom et al. |
| 4,707,030 A | 11/1987 | Harding |
| 4,711,589 A | 12/1987 | Goodbred |
| 4,763,360 A | 8/1988 | Daniels et al. |
| 4,776,809 A | 10/1988 | Hall |
| 4,830,531 A | 5/1989 | Condit et al. |
| 4,853,555 A | 8/1989 | Wheat |
| 4,961,559 A | 10/1990 | Raymor |
| 4,969,621 A | 11/1990 | Munchow et al. |
| 4,987,316 A | 1/1991 | White et al. |
| 5,106,144 A | 4/1992 | Hayakawa et al. |
| 5,137,331 A | 8/1992 | Colozza |
| 5,167,393 A | 12/1992 | Hayakawa et al. |
| 5,192,045 A | 3/1993 | Yamada et al. |
| 5,222,814 A | 6/1993 | Boelryk |
| 5,302,065 A | 4/1994 | Vogg et al. |
| 5,322,982 A | 6/1994 | Leger et al. |
| 5,332,290 A | 7/1994 | Borlinghaus et al. |
| 5,348,373 A | 9/1994 | Stiennon |
| 5,362,241 A | 11/1994 | Matsuoka et al. |
| 5,446,442 A | 8/1995 | Swart et al. |
| 5,466,892 A | 11/1995 | Howard et al. |
| 5,489,173 A | 2/1996 | Hofle |
| 5,582,381 A | 12/1996 | Graf et al. |
| 5,599,086 A | 2/1997 | Dutta |
| 5,618,192 A | 4/1997 | Drury |
| 5,655,816 A | 8/1997 | Magnuson et al. |
| 5,676,341 A | 10/1997 | Tarusawa et al. |
| 5,696,409 A | 12/1997 | Handman et al. |
| 5,701,037 A | 12/1997 | Weber et al. |
| 5,796,177 A | 8/1998 | Werbelow et al. |
| 5,800,015 A | 9/1998 | Tsuchiya et al. |
| 5,899,532 A | 5/1999 | Paisley et al. |
| 5,918,847 A | 7/1999 | Couasnon |
| 5,921,606 A | 7/1999 | Moradell et al. |
| 5,964,442 A | 10/1999 | Wingblad et al. |
| 5,964,815 A | 10/1999 | Wallace et al. |
| 6,008,547 A | 12/1999 | Dobler et al. |
| 6,036,157 A | 3/2000 | Baroin et al. |
| 6,081,044 A | 6/2000 | Anthofer et al. |
| 6,142,718 A | 11/2000 | Kroll |
| 6,150,774 A | 11/2000 | Mueller et al. |
| 6,166,451 A | 12/2000 | Pigott |
| 6,216,995 B1 | 4/2001 | Koester |
| 6,227,595 B1 | 5/2001 | Hamelin et al. |
| 6,290,516 B1 | 9/2001 | Gerber |
| 6,296,498 B1 | 10/2001 | Ross |
| 6,299,230 B1 | 10/2001 | Oettl |
| 6,318,802 B1 | 11/2001 | Sjostrom et al. |
| 6,325,645 B1 | 12/2001 | Schuite |
| 6,357,814 B1 | 3/2002 | Boisset et al. |
| 6,400,259 B1 | 6/2002 | Bourcart et al. |
| 6,405,988 B1 | 6/2002 | Taylor et al. |
| 6,422,596 B1 | 7/2002 | Fendt et al. |
| 6,439,531 B1 | 8/2002 | Severini et al. |
| 6,480,144 B1 | 11/2002 | Miller et al. |
| 6,565,119 B2 | 5/2003 | Fogle, Jr. |
| 6,566,765 B1 | 5/2003 | Nitschke et al. |
| 6,588,722 B2 | 7/2003 | Eguchi et al. |
| 6,693,368 B2 | 2/2004 | Schumann et al. |
| 6,710,470 B2 | 3/2004 | Bauer et al. |
| 6,719,350 B2 | 4/2004 | Duchateau et al. |
| 6,736,458 B2 | 5/2004 | Chabanne et al. |
| 6,772,056 B2 | 8/2004 | Mattes et al. |
| 6,805,375 B2 | 10/2004 | Enders et al. |
| 6,851,708 B2 | 2/2005 | Kazmierczak |
| 6,869,057 B2 | 3/2005 | Matsumoto et al. |
| 6,882,162 B2 | 4/2005 | Schirmer et al. |
| 6,960,993 B2 | 11/2005 | Mattes et al. |
| 7,042,342 B2 | 5/2006 | Luo et al. |
| 7,083,437 B2 | 8/2006 | Mackness |
| 7,086,874 B2 | 8/2006 | Mitchell et al. |
| 7,113,541 B1 | 9/2006 | Lys et al. |
| 7,159,899 B2 | 1/2007 | Nitschke et al. |
| 7,170,192 B2 | 1/2007 | Kazmierczak |
| 7,188,805 B2 | 3/2007 | Henley et al. |
| 7,207,541 B2 | 4/2007 | Frohnhaus et al. |
| 7,271,501 B2 | 9/2007 | Dukart et al. |
| 7,288,009 B2 | 10/2007 | Lawrence et al. |
| 7,293,831 B2 | 11/2007 | Greene |
| 7,300,091 B2 | 11/2007 | Nihonmatsu et al. |
| 7,322,605 B2 | 1/2008 | Ventura et al. |
| 7,348,687 B2 | 3/2008 | Aichriedler et al. |
| 7,363,194 B2 | 4/2008 | Schlick et al. |
| 7,370,831 B2 | 5/2008 | Laib et al. |
| 7,388,466 B2 | 6/2008 | Ghabra et al. |
| 7,389,960 B2 | 6/2008 | Mitchell et al. |
| 7,416,042 B2 | 8/2008 | Czaykowska et al. |
| 7,434,883 B2 | 10/2008 | Deptolla |
| 7,454,170 B2 | 11/2008 | Goossens et al. |
| 7,455,535 B2 | 11/2008 | Insalaco et al. |
| 7,503,522 B2 | 3/2009 | Henley et al. |
| 7,505,754 B2 | 3/2009 | Kazmierczak et al. |
| 7,523,913 B2 | 4/2009 | Mizuno et al. |
| 7,556,233 B2 | 7/2009 | Gryp et al. |
| 7,560,827 B2 | 7/2009 | Jacas-Miret et al. |
| 7,633,301 B2 | 12/2009 | Steenwyk et al. |
| 7,661,637 B2 | 2/2010 | Mejuhas et al. |
| 7,665,939 B1 | 2/2010 | Cardona |
| 7,739,820 B2 | 6/2010 | Frank |
| 7,744,386 B1 | 6/2010 | Speidel et al. |
| 7,980,525 B2 | 7/2011 | Kostin |
| 7,980,798 B1 | 7/2011 | Kuehn et al. |
| 8,010,255 B2 | 8/2011 | Darraba |
| 8,146,991 B2 | 4/2012 | Stanz et al. |
| 8,278,840 B2 | 10/2012 | Logiudice et al. |
| 8,282,326 B2 | 10/2012 | Krostue et al. |
| 8,376,675 B2 | 2/2013 | Schulze et al. |
| 8,463,501 B2 | 6/2013 | Jousse |
| 8,536,928 B1 | 9/2013 | Gagne et al. |
| 8,648,613 B2 | 2/2014 | Ewerhart et al. |
| 8,702,170 B2 | 4/2014 | Abraham et al. |
| 8,757,720 B2 | 6/2014 | Hurst, III et al. |
| 8,800,949 B2 | 8/2014 | Schebaum et al. |
| 8,857,778 B2 | 10/2014 | Nonomiya |
| 8,936,526 B2 | 1/2015 | Boutouil et al. |
| 8,967,719 B2 | 3/2015 | Ngiau et al. |
| RE45,456 E | 4/2015 | Sinclair et al. |
| 9,010,712 B2 | 4/2015 | Gray et al. |
| 9,018,869 B2 | 4/2015 | Yuasa et al. |
| 9,045,061 B2 | 6/2015 | Kostin et al. |
| 9,162,590 B2 | 10/2015 | Nagura et al. |
| 9,174,604 B2 | 11/2015 | Wellhoefer et al. |
| 9,242,580 B2 | 1/2016 | Schebaum et al. |
| 9,318,922 B2 | 4/2016 | Hall et al. |
| 9,340,125 B2 | 5/2016 | Stutika et al. |
| 9,346,428 B2 | 5/2016 | Bortolin |
| 9,422,058 B2 | 8/2016 | Fischer et al. |
| 9,561,770 B2 | 2/2017 | Sievers et al. |
| 9,608,392 B1 | 3/2017 | Destro |
| 9,610,862 B2 | 4/2017 | Bonk et al. |
| 9,663,232 B1 | 5/2017 | Porter et al. |
| 9,673,583 B2 | 6/2017 | Hudson et al. |
| 9,701,217 B2 | 7/2017 | Eckenroth et al. |
| 9,731,628 B1 | 8/2017 | Rao et al. |
| 9,758,061 B2 | 9/2017 | Pluta et al. |
| 9,789,834 B2 | 10/2017 | Rapp et al. |
| 9,796,304 B2 | 10/2017 | Salter et al. |
| 9,815,425 B2 | 11/2017 | Rao et al. |
| 9,821,681 B2 | 11/2017 | Rao et al. |
| 9,840,220 B2 | 12/2017 | Van Buskirk et al. |
| 9,919,624 B2 | 3/2018 | Cziomer et al. |
| 9,950,682 B1 | 4/2018 | Gramenos et al. |
| 10,059,232 B2 | 8/2018 | Frye et al. |
| 10,160,351 B2 | 12/2018 | Sugimoto et al. |
| 10,362,897 B2 | 7/2019 | De'Longhi |

(56) References Cited

U.S. PATENT DOCUMENTS

| | | |
|---|---|---|
| 10,363,846 B2 | 7/2019 | Gallagher et al. |
| 10,479,227 B2 | 11/2019 | Nolte et al. |
| 10,493,243 B1 | 12/2019 | Braham |
| 10,547,135 B2 | 1/2020 | Sugiura |
| 10,549,659 B2 | 2/2020 | Sullivan et al. |
| 10,654,378 B2 | 5/2020 | Pons |
| 2005/0046367 A1 | 3/2005 | Wevers et al. |
| 2005/0089367 A1 | 4/2005 | Sempliner |
| 2005/0150705 A1 | 7/2005 | Vincent et al. |
| 2005/0211835 A1 | 9/2005 | Henley et al. |
| 2005/0215098 A1 | 9/2005 | Muramatsu et al. |
| 2005/0230543 A1 | 10/2005 | Laib et al. |
| 2005/0236899 A1 | 10/2005 | Kazmierczak |
| 2005/0258676 A1 | 11/2005 | Mitchell et al. |
| 2006/0131470 A1 | 6/2006 | Yamada et al. |
| 2006/0164205 A1 | 7/2006 | Buckingham et al. |
| 2006/0208549 A1 | 9/2006 | Hancock et al. |
| 2006/0220411 A1 | 10/2006 | Pathak et al. |
| 2008/0021602 A1 | 1/2008 | Kingham et al. |
| 2008/0084085 A1 | 4/2008 | Mizuno et al. |
| 2008/0090432 A1 | 4/2008 | Patterson et al. |
| 2009/0014584 A1 | 1/2009 | Rudduck et al. |
| 2009/0129105 A1 | 5/2009 | Kusu et al. |
| 2009/0251920 A1 | 10/2009 | Kino et al. |
| 2009/0302665 A1 | 12/2009 | Dowty |
| 2009/0319212 A1 | 12/2009 | Cech et al. |
| 2010/0117275 A1 | 5/2010 | Nakamura |
| 2011/0024595 A1 | 2/2011 | Oi et al. |
| 2011/0225773 A1 | 9/2011 | Hearn et al. |
| 2012/0112032 A1 | 5/2012 | Kohen |
| 2013/0020459 A1 | 1/2013 | Moriyama et al. |
| 2013/0035994 A1 | 2/2013 | Pattan et al. |
| 2013/0153735 A1 | 6/2013 | Ruthman et al. |
| 2014/0110554 A1 | 4/2014 | Oya et al. |
| 2014/0263920 A1 | 9/2014 | Anticuar et al. |
| 2014/0265479 A1 | 9/2014 | Bennett |
| 2014/0269467 A1* | 9/2014 | Samanta Singhar ........... H04W 52/0251 370/311 |
| 2015/0048206 A1 | 2/2015 | Deloubes |
| 2015/0069807 A1 | 3/2015 | Kienke |
| 2015/0083882 A1 | 3/2015 | Stutika et al. |
| 2015/0191106 A1 | 7/2015 | Inoue et al. |
| 2015/0236462 A1 | 8/2015 | Davidson, Jr. et al. |
| 2016/0039314 A1 | 2/2016 | Anticuar et al. |
| 2016/0154170 A1 | 6/2016 | Thompson et al. |
| 2016/0236613 A1 | 8/2016 | Trier |
| 2017/0080825 A1 | 3/2017 | Bonk et al. |
| 2017/0080826 A1 | 3/2017 | Bonk et al. |
| 2017/0166093 A1 | 6/2017 | Cziomer et al. |
| 2017/0261343 A1 | 9/2017 | Lanter et al. |
| 2017/0291507 A1 | 10/2017 | Hattori et al. |
| 2018/0017189 A1 | 1/2018 | Wegner |
| 2018/0039917 A1 | 2/2018 | Buttolo et al. |
| 2018/0072188 A1 | 3/2018 | Yamada |
| 2018/0086232 A1 | 3/2018 | Kume |
| 2018/0105072 A1 | 4/2018 | Pons |
| 2018/0148011 A1 | 5/2018 | Zaugg et al. |
| 2018/0154799 A1 | 6/2018 | Lota |
| 2018/0183623 A1 | 6/2018 | Schoenfeld et al. |
| 2018/0244175 A1 | 8/2018 | Tan |
| 2018/0275648 A1 | 9/2018 | Ramalingam |
| 2019/0001846 A1 | 1/2019 | Jackson et al. |
| 2019/0084453 A1 | 3/2019 | Petit et al. |
| 2019/0126786 A1 | 5/2019 | Dry et al. |
| 2019/0337413 A1 | 11/2019 | Romer |
| 2019/0337414 A1 | 11/2019 | Condamin et al. |
| 2019/0337415 A1 | 11/2019 | Condamin et al. |
| 2019/0337416 A1 | 11/2019 | Condamin et al. |
| 2019/0337417 A1 | 11/2019 | Condamin et al. |
| 2019/0337418 A1 | 11/2019 | Condamin et al. |
| 2019/0337419 A1 | 11/2019 | Condamin et al. |
| 2019/0337420 A1 | 11/2019 | Condamin et al. |
| 2019/0337421 A1 | 11/2019 | Condamin et al. |
| 2019/0337422 A1 | 11/2019 | Condamin et al. |
| 2019/0337471 A1 | 11/2019 | Brehm |
| 2019/0379187 A1 | 12/2019 | Christensen et al. |
| 2019/0389336 A1 | 12/2019 | Malinowski et al. |
| 2020/0009995 A1 | 1/2020 | Sonar |
| 2020/0047641 A1 | 2/2020 | D'Eramo et al. |
| 2020/0055423 A1 | 2/2020 | Prozzi et al. |
| 2020/0079244 A1 | 3/2020 | Carbone et al. |
| 2020/0180516 A1 | 6/2020 | Moulin |
| 2020/0180517 A1 | 6/2020 | Moulin |
| 2020/0189504 A1 | 6/2020 | Ricart et al. |
| 2020/0189511 A1 | 6/2020 | Ricart et al. |
| 2020/0194936 A1 | 6/2020 | Ricart et al. |
| 2020/0194948 A1 | 6/2020 | Lammers et al. |
| 2020/0207241 A1 | 7/2020 | Moulin et al. |
| 2020/0247275 A1 | 8/2020 | Yetukuri et al. |
| 2020/0262367 A1 | 8/2020 | Banares et al. |
| 2020/0269754 A1 | 8/2020 | Ricart et al. |
| 2020/0282871 A1 | 9/2020 | Ricart et al. |
| 2020/0282880 A1 | 9/2020 | Jones et al. |

FOREIGN PATENT DOCUMENTS

| | | |
|---|---|---|
| CN | 203799201 U | 8/2014 |
| CN | 104471497 A | 3/2015 |
| CN | 108973807 A | 12/2018 |
| DE | 202005013714 U1 | 12/2005 |
| DE | 102005007430 A1 | 3/2006 |
| DE | 102006022032 A1 | 12/2006 |
| DE | 102010017038 A1 | 2/2011 |
| DE | 102011056278 A1 | 2/2013 |
| DE | 202014102336 U1 | 6/2014 |
| DE | 102015212100 A1 | 12/2015 |
| DE | 102016113409 A1 | 4/2017 |
| EP | 0783990 A1 | 7/1997 |
| EP | 1176047 A1 | 1/2002 |
| EP | 2298609 B1 | 3/2011 |
| EP | 3150426 A1 | 4/2017 |
| FR | 2762814 A1 | 11/1998 |
| FR | 2951329 A1 | 4/2011 |
| FR | 2986751 A1 | 8/2013 |
| JP | 3314591 B2 | 8/2002 |
| JP | 2003227703 A | 8/2003 |
| JP | 2005119518 A | 5/2005 |
| JP | 2007112174 A | 5/2007 |
| JP | 2008158578 A | 7/2008 |
| JP | 4222262 B2 | 2/2009 |
| JP | 2013230721 A | 11/2013 |
| WO | 01/87665 A1 | 11/2001 |
| WO | 2003002256 A2 | 1/2003 |
| WO | 2005068247 A2 | 7/2005 |

OTHER PUBLICATIONS

Co-Pending U.S. Appl. No. 16/672,989, filed Nov. 4, 2019.
Co-Pending U.S. Appl. No. 16/711,661, filed Dec. 12, 2019.
Co-Pending U.S. Appl. No. 17/060,566, filed Oct. 1, 2020.
Co-Pending U.S. Appl. No. 17/060,985, filed Oct. 1, 2020.
Chinese Office Action for Chinese Patent Application No. 202011073510.3.

* cited by examiner

ELECTRICAL SYSTEM

CROSS-REFERENCE TO RELATED APPLICATION

This application claims the benefit of U.S. Provisional Patent Application Ser. No. 62/910,659, filed on Oct. 4, 2019, the disclosure of which is hereby incorporated by reference in its entirety as though fully set forth herein.

TECHNICAL FIELD

The present disclosure generally relates to electrical systems, including electrical systems that may, for example, be used in connection with vehicles, vehicle seats, and/or vehicle components.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Some electrical systems may not operate efficiently and/or may consume relatively large amounts of power.

There is a desire for solutions/options that minimize or eliminate one or more challenges or shortcomings of electrical systems. The foregoing discussion is intended only to illustrate examples of the present field and is not a disavowal of scope.

SUMMARY

In embodiments, an electrical system may include an electrical unit that may include a power source, a switch assembly connected to the power source, an activation portion that may include a pulse generator connected to the switch assembly, and/or a controller selectively connected to power source via the switch assembly.

With embodiments, an electrical system may include an electrical unit including a power source, a switch assembly connected to the power source, an activation portion connected to the switch assembly, an electrical latch connected to the pulse generator and/or the switch assembly, and/or a controller connected to the switch assembly and the electrical latch. An embodiment of a method of operating an electrical system may include activating the activation portion; activating, via the activation portion, the switch assembly to connect the controller with the power source; latching the switch assembly in an activated state via the electrical latch; operating the controller to control one or more electrical loads connected to the controller; and/or unlatching the switch assembly via the controller to disconnect the controller from the power source.

The foregoing and other potential aspects, features, details, utilities, and/or advantages of examples/embodiments of the present disclosure will be apparent from reading the following description, and from reviewing the accompanying drawings.

BRIEF DESCRIPTION OF THE DRAWINGS

While the claims are not limited to a specific illustration, an appreciation of various aspects may be gained through a discussion of various examples. The drawings are not necessarily to scale, and certain features may be exaggerated or hidden to better illustrate and explain an innovative aspect of an example. Further, the exemplary illustrations described herein are not exhaustive or otherwise limiting, and are not restricted to the precise form and configuration shown in the drawings or disclosed in the following detailed description. Exemplary illustrations are described in detail by referring to the drawings as follows:

DETAILED DESCRIPTION

Reference will now be made in detail to embodiments of the present disclosure, examples of which are described herein and illustrated in the accompanying drawings. While the present disclosure will be described in conjunction with embodiments and/or examples, they do not limit the present disclosure to these embodiments and/or examples. On the contrary, the present disclosure covers alternatives, modifications, and equivalents.

Figure 1:
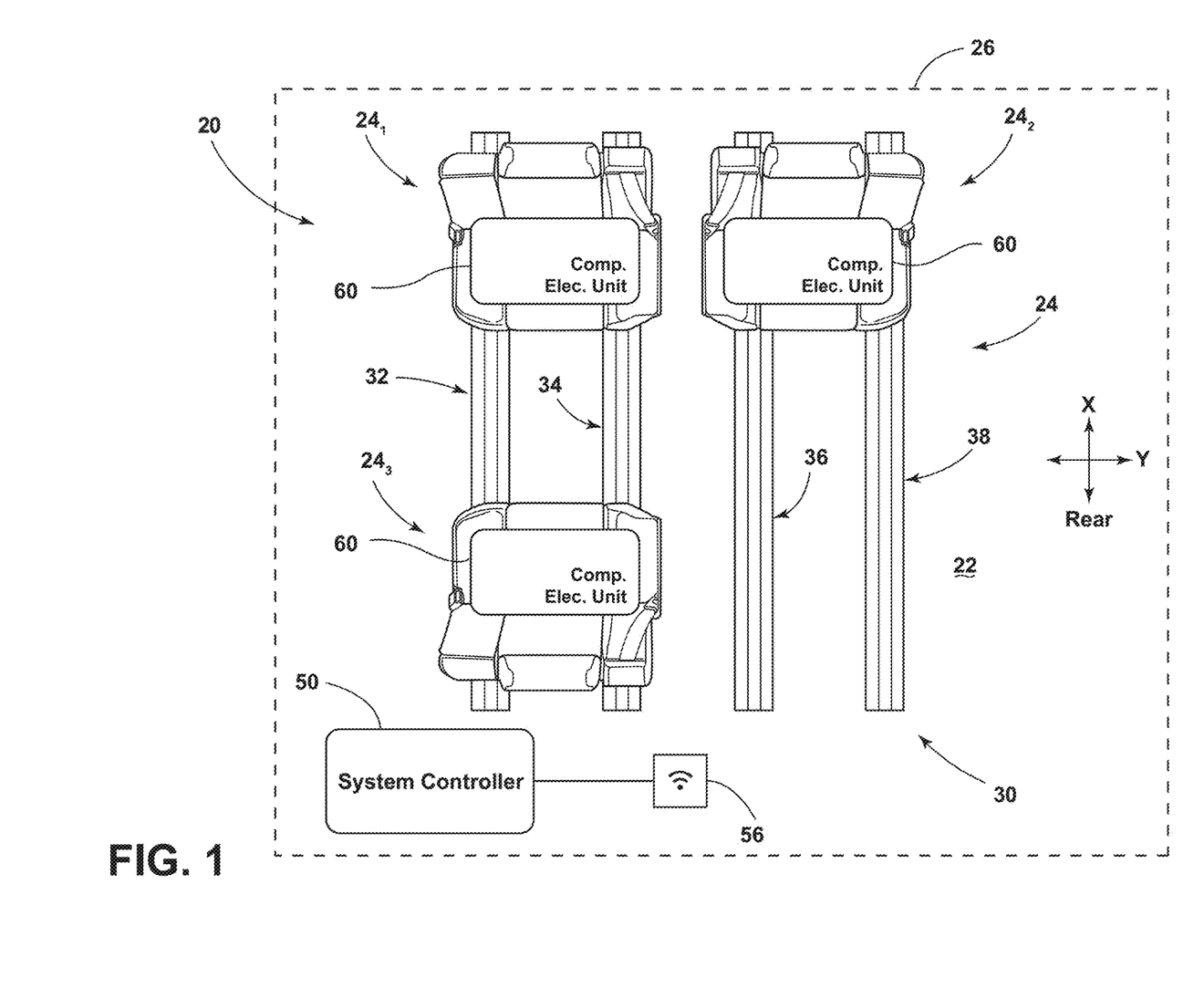
FIG. 1 is a top view generally illustrating an embodiment of an electrical system according to teachings of the present disclosure.
Figure 2:
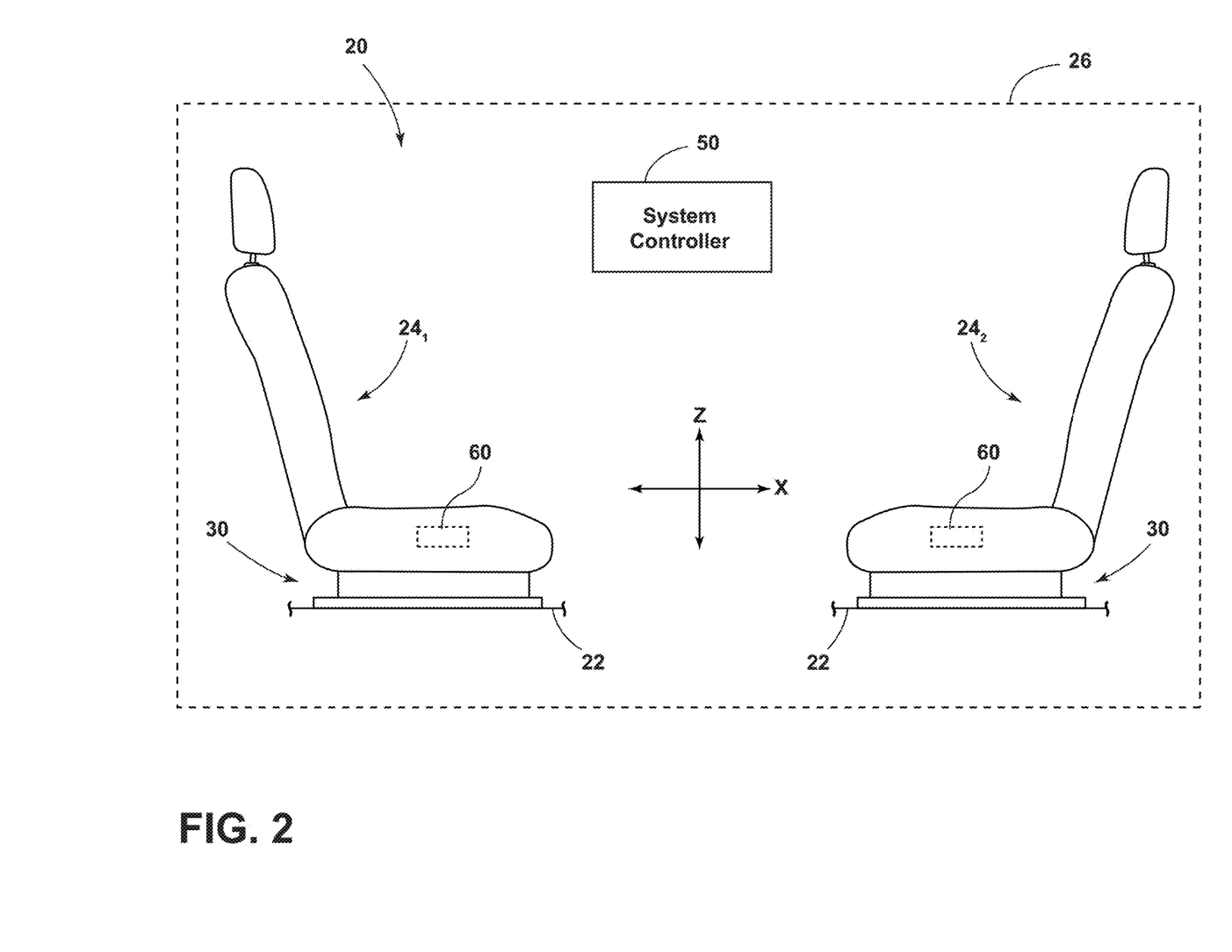
FIG. 2 is a side view generally illustrating an embodiment of an electrical system according to teachings of the present disclosure.

In embodiments, such as generally illustrated in FIGS. 1 and 2, an electrical system 20 may include a mounting surface 22 and one or more components 24 (e.g., a first component 241, a second component 242, and/or a third component 243) that may be selectively connected to the mounting surface 22. The mounting surface 22 may, for example and without limitation, include a floor and/or a surface of a vehicle 26. The components 24 may, for example and without limitation, include and/or be connected to seats (e.g., vehicle seats), consoles, tables, and/or other components. The components 24 may be selectively removable from the mounting surface 22, may be reconfigurable, may be movable along and relative to the mounting surface 22, and/or may be connected to the mounting surface 22 in a plurality of orientations (e.g., the electrical system 20 may be configured as a removable component system), such as without additional or external tools.

In examples, an electrical system 20 may include a track/rail assembly 30 that may include a first track/rail 32, a second track/rail 34, a third track/rail 36, and/or a fourth track/rail 38 (or more or fewer tracks/rails), which may be extend substantially in parallel with each other (e.g., in a longitudinal/X-direction) and/or may be offset from each other in a lateral direction (e.g., a Y-direction). The track/rail assembly 30 may be substantially fixed to the mounting surface 22 such that the track/rail assembly 30 may move with the mounting surface 22 and at least a portion of the track/rail assembly 30 may not move relative to the mounting surface 22. The one or more components 24 may, with some embodiments, be selectively connected to (e.g., mechanically and/or electrically), removed from, moved (e.g., slid) along/relative to, the mounting surface 22 via the track/rail assembly 30, such as without additional or external tools (e.g., may be selectively secured to and removed from the track assembly 30 in a plurality of positions/orientations along the track assembly 30).

Figure 2A:
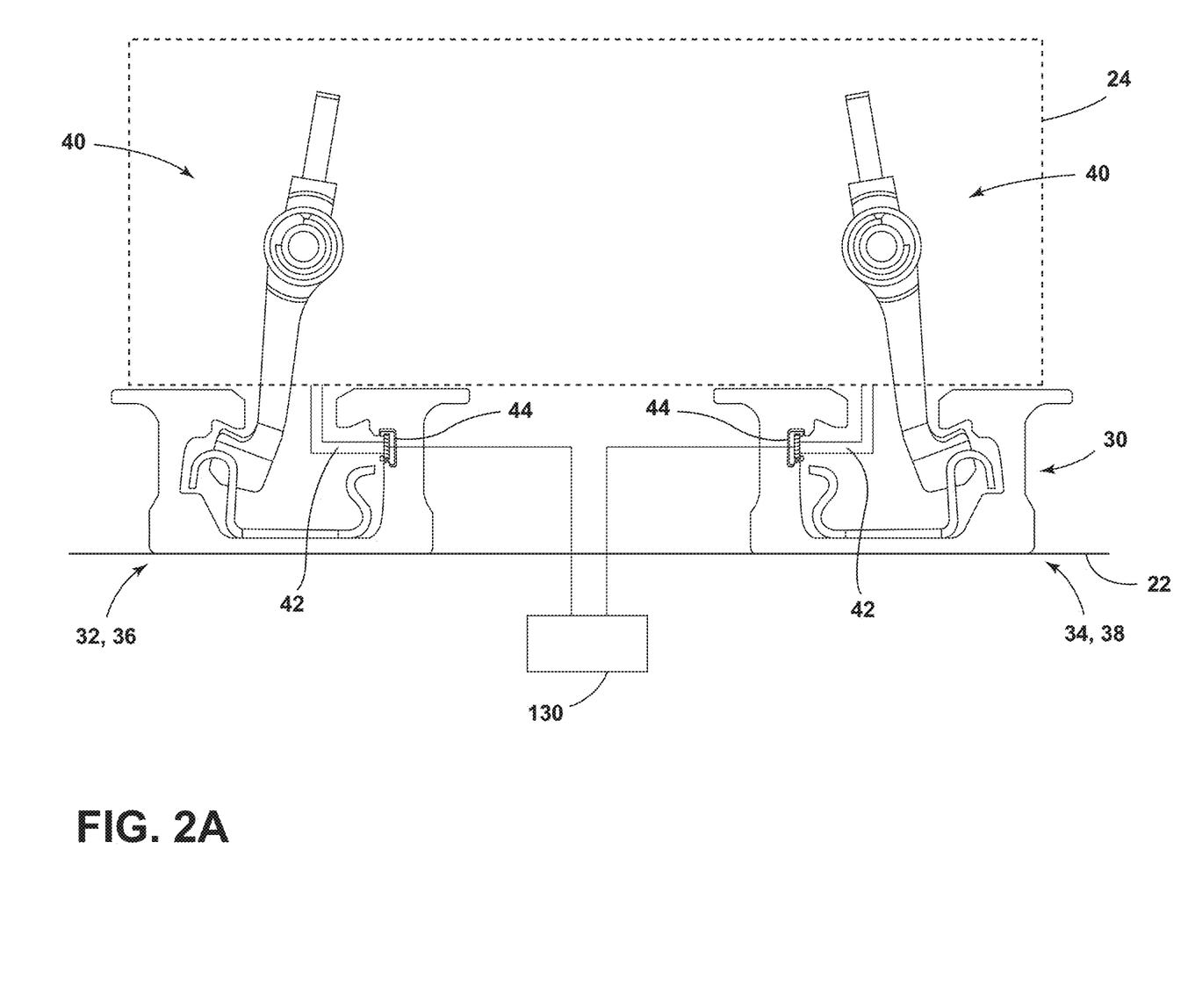
FIG. 2A is an end view generally illustrating an embodiment of a track assembly of an electrical system according to teachings of the present disclosure.

In embodiments, a component 24 may, for example and without limitation, include one or more mechanical latches/anchors 40 that may be configured to selectively engage and/or contact the track assembly 30 to restrict or prevent movement of a component 24 in one or more directions (e.g., an X-direction and/or a Z-direction of the track assembly 30), and/or one or more electrical contacts 42 that may be configured to selectively contact a conductor 44 of a track assembly 30, such as to provide power from a power source 130 (e.g., a vehicle battery) to the component 24 (see, e.g., FIG. 2A). In some embodiments, a power source 130 may not be connected to the track assembly 30 and/or may not be electrically connected to one or more components 24. The one or more mechanical latches/anchors 40 and/or the one or more electrical contacts 42 may be actuated (e.g, rotated) between engaged/connected positions and disengaged/disconnected positions in one or more of a variety of ways, such as mechanically (e.g., via a lever/slider/cable, manually, etc.) and/or electronically (e.g., via an electric actuator/motor). The one or more mechanical latches/anchors 40 and/or the one or more electrical contacts 42 may restrict insertion/removal of a component 24 when in engaged/connected positions, and/or may not restrict insertion/removal of a component 24 when in disengaged/disconnected positions.

With examples, an electrical system 20 may include a system controller 50 (e.g., an electronic controller) that may be configured to monitor and/or control at least one component 24. The system controller 50 may be connected (e.g., fixed), at least indirectly (e.g., with intermediate elements such that relative movement between the system controller 50 and the mounting surface 22 may be substantially prevented), to the mounting surface 22 and/or may move with the mounting surface 22 if the mounting surface 22 moves. The system controller 50 may be configured for wired and/or wireless communication. The system controller 50 may, for example, include an electronic processor 52, a memory 54, and/or a communication device 56 (e.g., a receiver, a transmitter, a transceiver, etc.).

Figure 3:
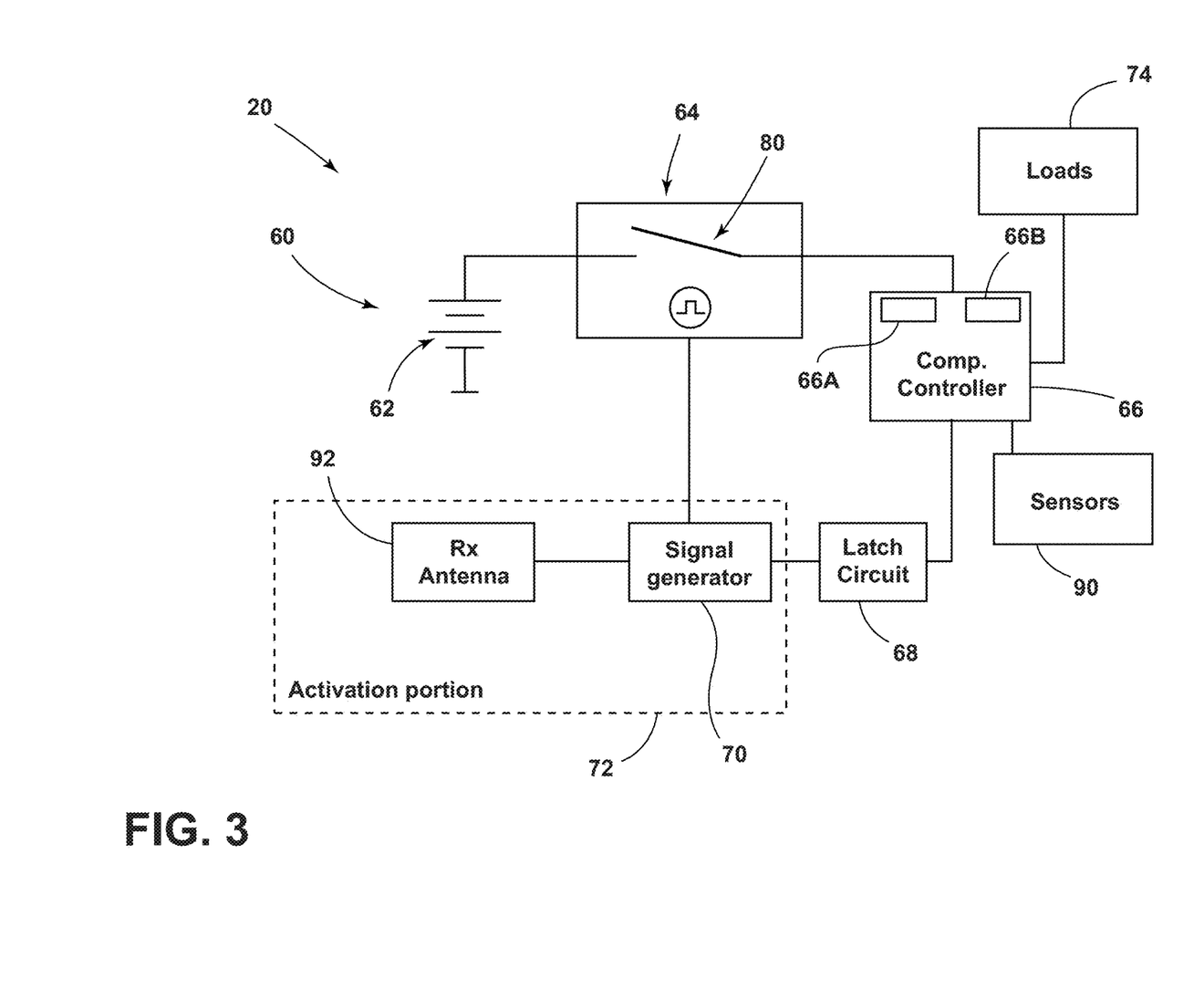
FIG. 3 is a schematic view generally illustrating an embodiment of an electrical system according to teachings of the present disclosure.

In examples, a component 24 may include and/or be connected to a respective component electrical unit 60. A component electrical unit 60 may include one or more of a variety of configurations. As generally illustrated in FIG. 3, for example, embodiments of a component electrical unit 60 may include and/or be connected to a power source 62 (e.g., a battery), a switch assembly 64, a component controller 66, an electrical latch or latch circuit 68, a pulse generator 70, an activation portion 72, and/or one or more electrical loads 74 (e.g., actuators/motors, heaters, fans, safety devices, etc.). A component controller 66 may, for example, include an electronic processor 66A and/or a memory 66B. The power source 62 may be included with the component 24 and/or may be separate from and connected to the component 24. For example and without limitation, a power source 62 may include a backup battery included with the component 24 and a vehicle battery that may be disposed separate from and selectively connected to the component (e.g., via the track assembly 30).

With examples, it may be desirable to limit the power consumption of a component electrical unit 60, such as to provide greater power efficiency, to avoid depleted power sources/batteries (e.g., power source 62), to limit electrical component cycles, and/or other reasons. Embodiments of electrical systems 20 may be configured for limiting power consumption of component electrical units 60. For example, an electrical system 20 may be configured to shut down and/or disconnect component controllers 66 that are not actively being used, such as instead of leaving component controllers 66 in a low power or standby state that may, for example and without limitation, consume about 6 µA.

Figure 4:
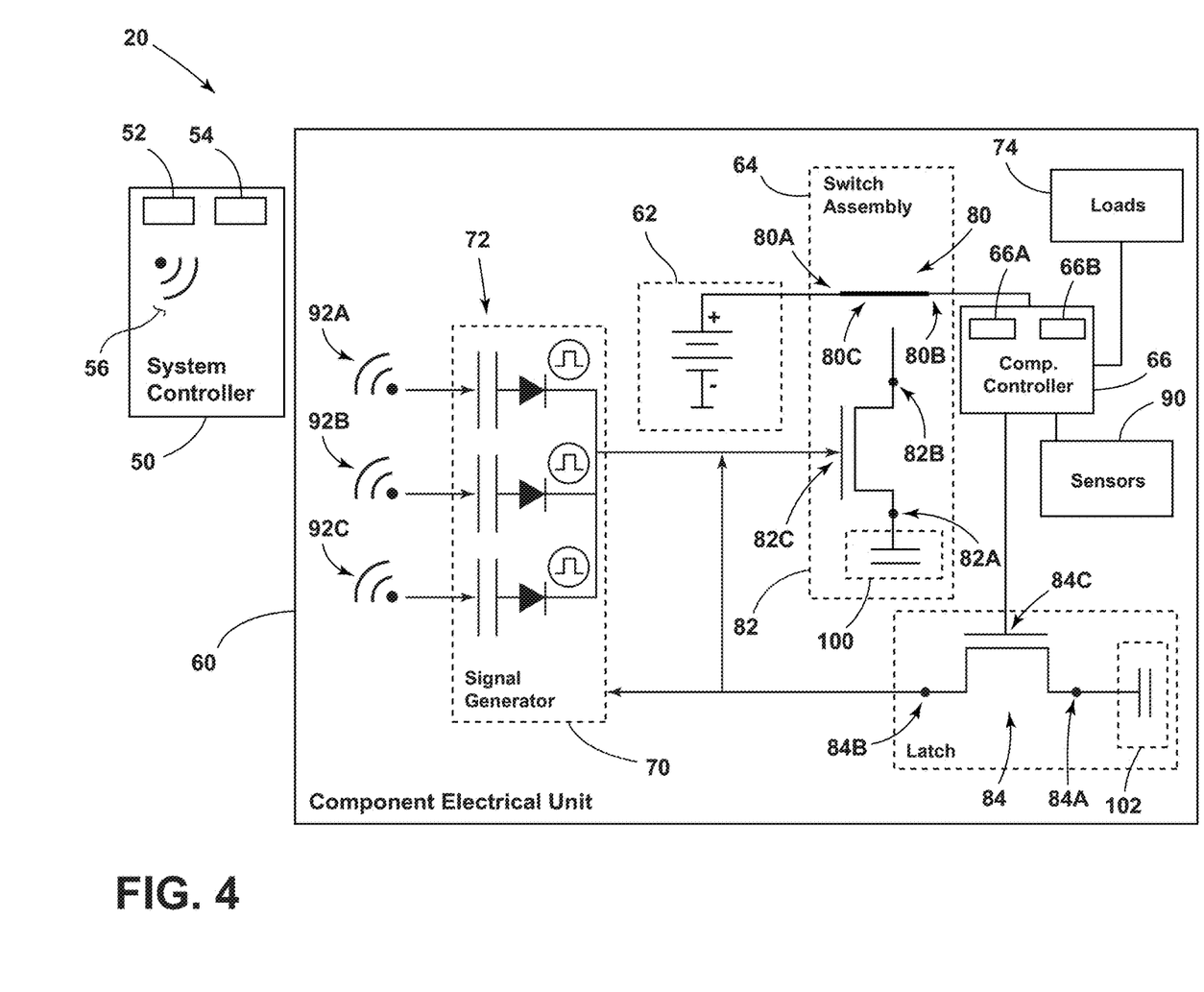
FIG. 4 is a schematic view generally illustrating an embodiment of an electrical system according to teachings of the present disclosure.

In embodiments, a switch assembly 64 may be connected to the power source 62 and may control current flow to the component controller 66 and/or one or more loads 74 of the component electrical unit 60 and/or the component 24. The switch assembly 64 may include a first switch 80 and/or a second switch 82 (see, e.g., FIG. 4). The first switch 80 may be connected to the power source 62 and the component controller 66. For example, the first switch 80 may include an input 80A that may be connected to the power source 62, an output 80B that may be connected to the component controller 66, and/or a control input 80C via which the first switch 80 may be controlled. The first switch 80 may, for example and without limitation, be configured as a relay or contactor. When the first switch 80 is in a first state (e.g., deactivated, inactive, open, etc.), such as generally shown in FIG. 3, current may not flow from the power source 62 to the component controller 66 and/or the one or more loads 74, and the component electrical unit 60 may not consume any power from the power source 62 (e.g., the component controller 66 may be disconnected from the power source 62 and/or shut down). When the first switch 80 is in a second state (e.g., activated, active, closed, etc.), such as generally shown in FIG. 4, the switch assembly 64 may provide and/or permit the flow of current from the power source 62 to the component controller 66 and/or one or more loads 74, which may activate (e.g., turn on, power up, etc.) the component controller 66. When the component controller 66 is activated (e.g., via activation of the switch assembly 64), the component controller 66 may be configured to obtain information (e.g., occupancy status, seatbelt status, etc.) from one or more sensors 90 (e.g., seatbelt sensors, occupancy sensors, etc.) that may be associated with the component 24 and/or the mounting surface 22 (e.g., with a vehicle 26), and/or the component controller 66 may be configured to transmit the information, such as to the system controller 50.

With embodiments, a second switch 82 may include an input 82A that may be connected to a power source 100 (e.g., a battery, a capacitor, etc.), an output 82B that may be connected to a control input 80C of the first switch 80, and/or a control/gate input 82C that may be connected to the activation portion 72 and/or the latch 68. The power source 100 may be connected to, at least partially integrated with the power source 62, and/or may be the same as the power source 62, or may be independent of the power source 62. The second switch 82 may, for example and without limitation, be configured as a solid-state switch, a transistor, and/or a MOSFET (metal-oxide-semiconductor field-effect transistor), among other configurations. The second switch 82 may be configured to control (e.g., activate/deactivate) the first switch 80, such as via the control input 80C. For example, when activated, the second switch 82 may provide a connection between the power source 100 and the control input 80C of the first switch 80, which may activate the first switch 80. The switch assembly 64 may, for example, be bistable.

With embodiments, a pulse generator 70 may be connected to the second switch 82 (e.g., to a control/gate input 82C) of the switch assembly 64. The pulse generator 70 may be configured to generate a signal or pulse that may activate the second switch 82, which may then activate the first switch 80 and/or direct activation of the first switch 80. Once the first switch 80 is activated, the component controller 66 may be activated/powered on and may control an electrical latch/latch circuit 68, which may be connected to the pulse generator 70 and/or the switch assembly 64, such as to maintain the second switch 82 and the first switch 80 in activated states.

In embodiments, an electrical latch 68 may include a latch switch 84 that may be connected to a power source 102 of the electrical latch 68, the component controller 66, the activation portion 72 (e.g., to the pulse generator 70), and/or the switch assembly 64. An input 84A of the latch switch 84 may be connected to the power source 102, which may be connected to, be at least partially integrated with, and/or be the same as the power source 62, or may be independent of the power source 62. An output 84B of the latch switch 84 may be connected to the activation portion 72 and/or the pulse generator 70. Additionally or alternatively, the output 84B may be connected (e.g., directly) to the switch assembly 64 (see, e.g., FIGS. 4 and 6). When the latch 68 is active, for example, the latch 68 may activate or maintain the activation of the switch assembly 64, such as (i) directly via providing a connection from the power source 102 to the control/gate input 82C of the second switch 82, and/or (ii) indirectly via providing a connection from the power source 102 to the activation portion 72, which may cause/allow the activation portion 72 to provide or continue to provide an activation signal (e.g., provide and/or extend a pulse or "high" signal) to the switch assembly 64. A control/gate input 84C of the latch 68 may be connected to the component controller 66. The component controller 66 may be configured to control the latch 68, at least in part, between an active/latching state and an inactive/non-latching/unlatched state, such as via the control/gate input 84C.

In embodiments, once a component controller 66 is activated/turned on, the component controller 66 may activate the latch 68 to maintain an electrical connection with the power source 62. If a component controller 66 determines that additional action is not desired (e.g., after a time-out period with no loads active, after all requested information is transmitted to the system controller 50, upon receiving a shutdown command from the system controller 50, etc.), the component controller 66 may control (e.g., deactivate) the latch 68 to deactivate/unlatch the switch assembly 64, which may power down and/or disconnect the component controller 66 (e.g., the component controller 66 may power itself and/or the component electrical unit 60 down).

With examples, an activation portion 72 may be connected to and/or include a signal/pulse generator 70. A signal/pulse generator 70 may be configured to provide and transmit one or more of a variety of signals, such as a pulse signal, and may be referred to herein as a pulse generator 70, but is not limited to a pulse generator. A pulse signal may for example and without limitation, include a short pulse and/or a long/extended pulse that may correspond to a length of time that power is requested/desired for the component controller 66.

With embodiments, an activation portion 72 may include one or more of a variety of configurations. For example, as generally illustrated in FIGS. 3 and 4, an activation portion 72 may include one or more antennas 92 that may be configured to receive signals (e.g., external trigger signals or pulses), such as from a communication device 56 (e.g., a transmitter/transceiver) of the system controller 50. The activation portion 72 may be configured to provide trigger signal(s) or pulse(s) to the pulse generator 70, and the pulse generator 70 may provide an activation signal to the switch assembly 64 which may activate the switch assembly 64. A trigger signal or pulse (and/or power/energy therefrom) may, for example and without limitation, be sufficient for the activation of the switch assembly 64 such that the pulse generator 70 may not be connected (e.g., other than via the latch 68) to the power source 62 or a different power source.

In examples, such as generally illustrated in FIG. 4, an antenna 92 of an activation portion may include a three-dimensional (3D) antenna and/or a plurality of antennas that may include a first portion/antenna 92A, a second portion/antenna 92B, and/or a third portion/antenna 92C. The antenna 92 and/or the pulse generator 70 may be configured to combine the components of incoming trigger signals from the antennas/antenna portions 92A, 92B, 92C into a combined activation signal. The pulse generator 70 may be configured to receive and/or utilize the combined activation signal to activate the switch assembly 64 and/or activate the component electrical unit 60. For example and without limitation, the activation portion 72 may be configured to directly utilize an incoming trigger signal or a combination of incoming trigger signals to activate the switch assembly 64. With embodiments, an antenna 92 may, for example, include a one-dimensional antenna, a two-dimensional antenna, a three-dimensional antenna, and/or a plurality of antennas. Use of more than one antenna 92 may be particularly useful if components 24 are reconfigurable in the vehicle 26 and the system controller 50 wishes to be able to sense the positions or orientations of components 24 in the vehicle 26.

Figure 5:
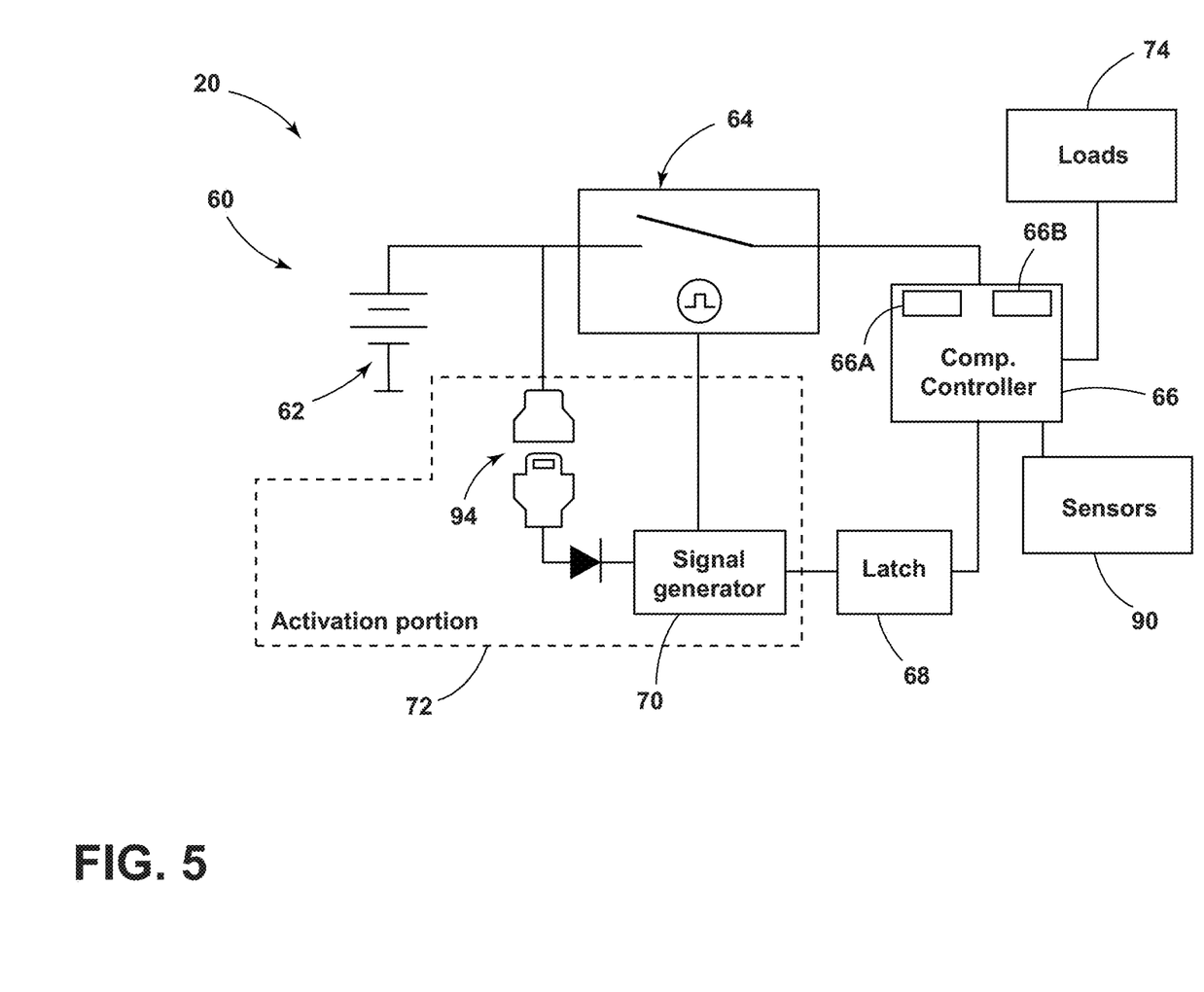
FIG. 5 is a schematic view generally illustrating an embodiment of an electrical system according to teachings of the present disclosure.

With examples, such as generally illustrated in FIG. 5, an activation portion 72 may provide a selective connection between the power source 62 and the pulse generator 70. The selective connection may, for example and without limitation, be provided by an activator 94, which may include a mechanical activator/component (e.g., a seat belt buckle), an occupancy sensor, and/or a reed switch, among others. For example, if an activator 94 includes a seat belt buckle and the seat belt buckle is not buckled, the activator 94 may not connect the power source 62 to the pulse generator 70, and the pulse generator 70 may not activate the switch assembly 64. When the seat belt buckle is buckled, the activator 94 may provide an electrical connection between the power source 62 and the pulse generator 70, which may result in the pulse generator 70 activating the switch assembly 64. Additionally or alternatively, the pulse generator 70 may be configured to sense a change in the connection state of the activator 94 and may be configured to activate the switch assembly 64 for a period of time upon sensing any change or upon a specific change (e.g., buckled).

Figure 6:
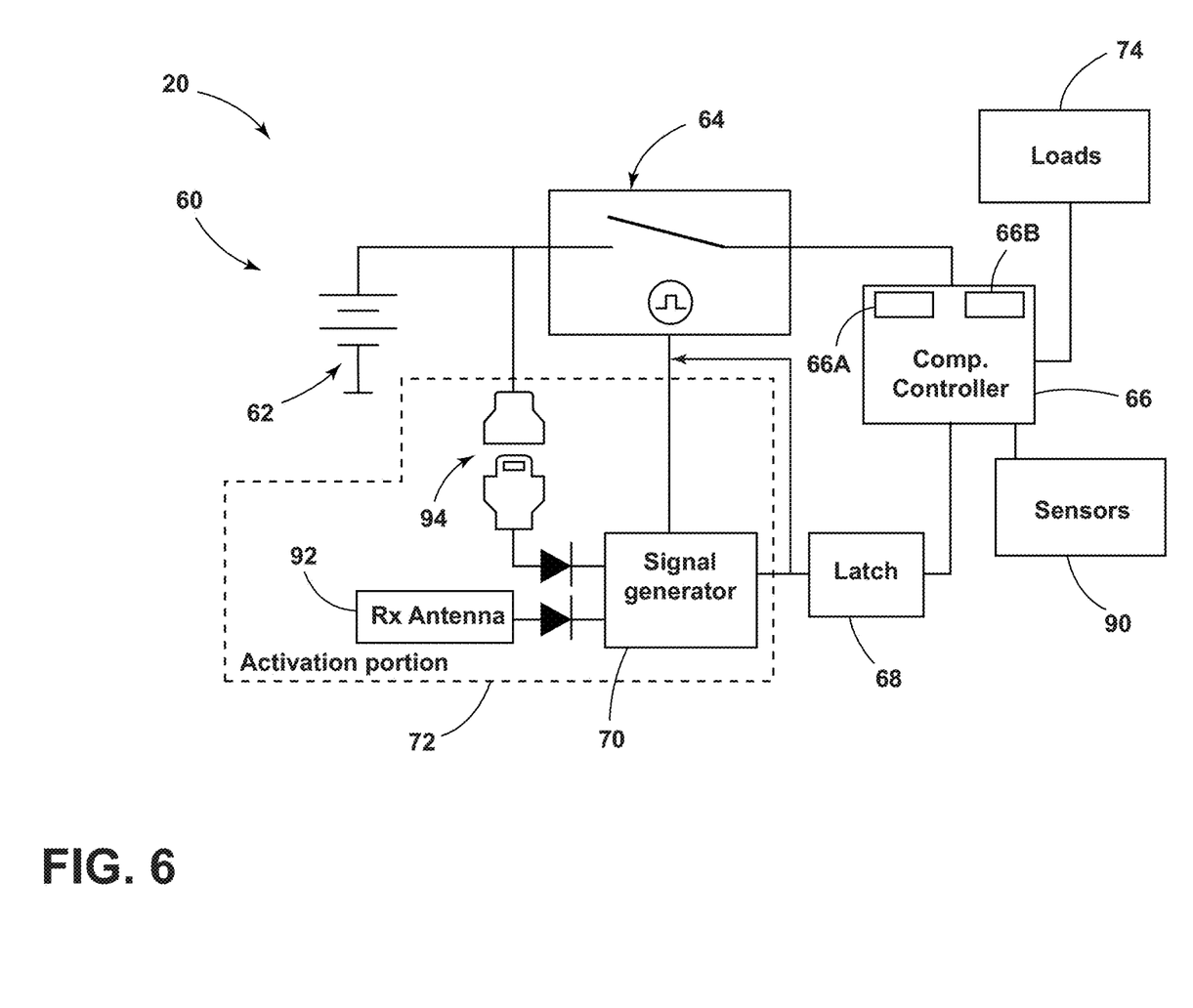
FIG. 6 is a schematic view generally illustrating an embodiment of an electrical system according to teachings of the present disclosure.

In embodiments, such as generally illustrated in FIG. 6, an activation portion 72 may include an antenna 92 and an activator 94, either or both of which may be configured to activate (e.g., provide power to, provide a signal to, etc.) the pulse generator 70 and/or the switch assembly 64. In that way, a component controller 66 can be awakened, for instance, either by a change of state of the activator 94 or by a radio-frequency signal sent to an antenna 92 by the system controller 50. While "asleep", the component controller 66 may be completely disconnected from power sources 62, 100, and 102 and may draw no current at all. This can be particularly advantageous in configurations of a system 20 where components 24 are not powered from a power source external to the components 24 via wiring or through rails 32, 34, 36, 38 (e.g., are not powered or recharged via the power source 130). Where an external power source 130, such as the vehicle's battery, powers components 24, that power source 130 and/or the power source 62 of a component 24 may be regularly recharged in the normal course of operation of the vehicle 26 (e.g., the power source 130 may be recharged and/or may recharge the power source 62). However, where no power source external to components 24 is used (e.g., if a power source 130 is not included and/or not connected), the power source 62 of a component 24 may not be recharged in the normal course of vehicle operation and limiting current draw may extend the operational life of the power source(s) 62.

Figure 7:
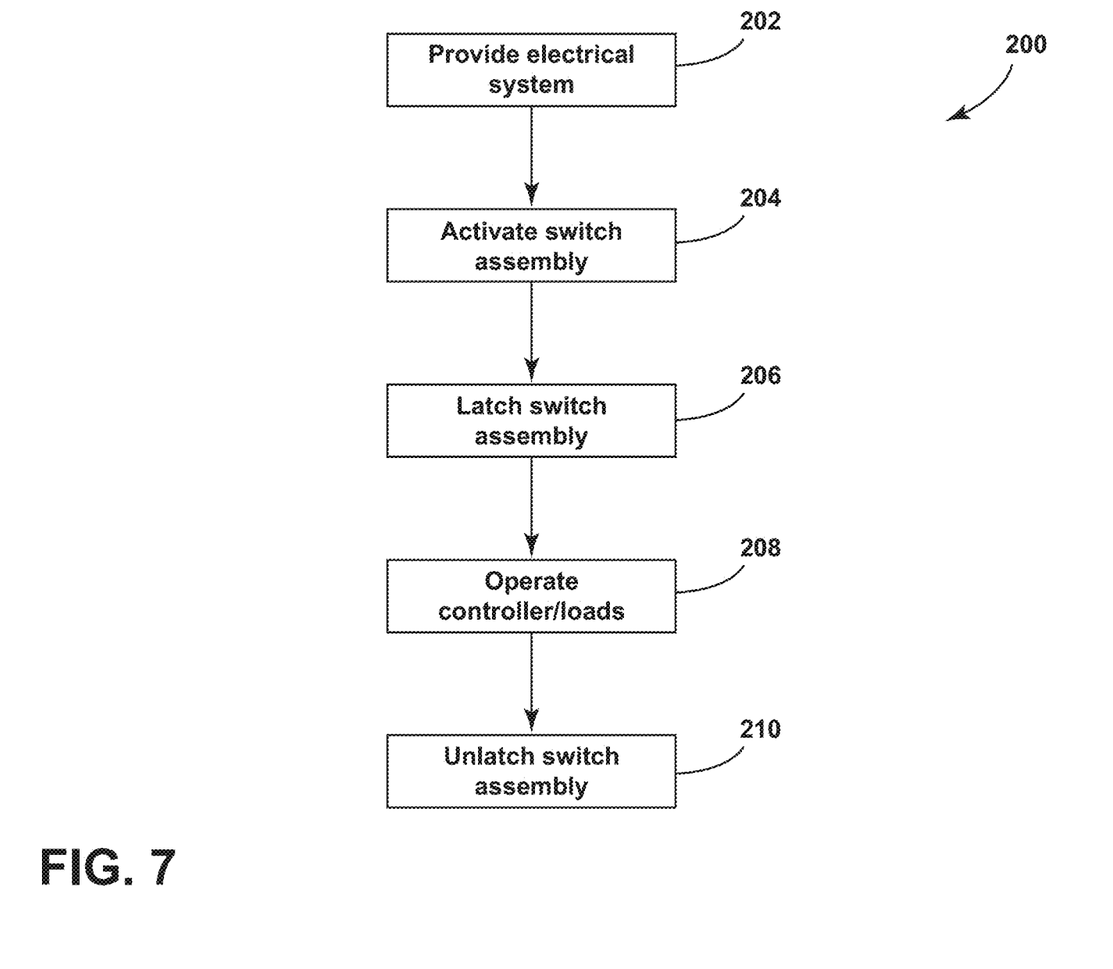
FIG. 7 is a flow chart generally illustrating an embodiment of a method of operating an electrical system according to teachings of the present disclosure.

With embodiments, such as generally illustrated in FIG. 7, a method 200 of operating an electrical system 20 may include providing the electrical system 20 (block 202), activating, via an activation portion 72, a switch assembly 64 to electrically connect a component controller 66 with a power source 62 (block 204), latching the switch assembly 64 in an activated state via an electrical latch 68 (block 206), controlling, via operating the component controller 66, one or more loads 74 (e.g., actuators/motors, heaters, fans, safety devices, etc.) (block 208), and/or unlatching the switch assembly via the component controller 66 to disconnect the component controller 66 from the power source 62 (block 210), which may prevent further power consumption by and/or improve the energy efficiency of the component controller 66. Activating the activation portion 72 may include activating a pulse generator 70 of the activation portion 72 via providing a signal or signals from a system controller 50 to an antenna/receiver 92 of the activation portion 72 and providing the signal or a combination of received signals from the antenna 92 to the pulse generator 70. The signal or signals from the antenna 92 may be sufficient for the pulse generator 70 to utilize (e.g., directly) to generate an activation signal to activate the switch assembly 64. The pulse generator 70 may not be separately electrically connected to the power source 62 or another/any other power source.

With embodiments, a system controller 50 may be configured to control one or more other systems, such as a propulsion system of a vehicle 26.

In examples, a controller (e.g., a system controller 50, a component controller 66, etc.) may include an electronic controller and/or include an electronic processor, such as a programmable microprocessor and/or microcontroller. In embodiments, a controller may include, for example, an application specific integrated circuit (ASIC). A controller may include a central processing unit (CPU), a memory (e.g., a non-transitory computer-readable storage medium), and/or an input/output (I/O) interface. A controller may be configured to perform various functions, including those described in greater detail herein, with appropriate programming instructions and/or code embodied in software, hardware, and/or other medium. In embodiments, a controller may include a plurality of controllers. In embodiments, a controller may be connected to a display, such as a touchscreen display.

Various examples/embodiments are described herein for various apparatuses, systems, and/or methods. Numerous specific details are set forth to provide a thorough understanding of the overall structure, function, manufacture, and use of the examples/embodiments as described in the specification and illustrated in the accompanying drawings. It will be understood by those skilled in the art, however, that the examples/embodiments may be practiced without such specific details. In other instances, well-known operations, components, and elements have not been described in detail so as not to obscure the examples/embodiments described in the specification. Those of ordinary skill in the art will understand that the examples/embodiments described and illustrated herein are non-limiting examples, and thus it can be appreciated that the specific structural and functional details disclosed herein may be representative and do not necessarily limit the scope of the embodiments.

Reference throughout the specification to "examples, "in examples," "with examples," "various embodiments," "with embodiments," "in embodiments," or "an embodiment," or the like, means that a particular feature, structure, or characteristic described in connection with the example/embodiment is included in at least one embodiment. Thus, appearances of the phrases "examples, "in examples," "with examples," "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more examples/embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of examples/embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." in the specification is to be construed broadly and is used to provide non-limiting examples of embodiments of the disclosure, and the disclosure is not limited to such examples. Uses of "and" and "or" are to be construed broadly (e.g., to be treated as "and/or"). For example and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

It should be understood that a controller, a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

It should be further understood that an article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. An electrical system, comprising:
an electrical unit, including:
a power source;
a switch assembly electrically connected to the power source;
an activation portion including a pulse generator electrically connected to the switch assembly; and
a controller selectively electrically connected to the power source via the switch assembly;
wherein the activation portion includes an antenna.

2. The electrical system of claim 1, including a vehicle component configured for selective connection with, movement relative to, and removal from a vehicle mounting surface, wherein:
the electrical unit is connected to move with and/or incorporated with the vehicle component; and
the power source is configured as a battery of the vehicle component.

3. The electrical system of claim 1, wherein:
the electrical unit includes an electrical latch connected to the pulse generator and/or the switch assembly; and
the controller is configured to control, at least in part, the electrical latch to (i) latch the switch assembly in an active state to provide power from the power source to the controller, and (ii) unlatch the switch assembly to electrically disconnect the controller from the power source.

4. The electrical system of claim 1, wherein, in an inactive state of the switch assembly, the controller does not consume power.

5. The electrical system of claim 1, wherein the pulse generator is configured to utilize signals received by the antenna to activate and/or control the switch assembly.

6. The electrical system of claim 1, wherein the antenna includes a plurality of antenna portions;
the pulse generator is configured to combine signals received from the plurality of antenna portions to generate a combined activation signal; and
the pulse generator is configured to provide the combined activation signal to the switch assembly to activate and/or control the switch assembly.

7. An electrical system, comprising:
an electrical unit, including:
a power source;
a switch assembly electrically connected to the power source;
an activation portion including a pulse generator electrically connected to the switch assembly; and
a controller selectively electrically connected to the power source via the switch assembly;
wherein the activation portion includes an activator configured to selectively electrically connect the pulse generator with the power source.

8. The electrical system of claim 7, wherein the activation portion includes an activator that includes a seatbelt, an occupancy sensor, and/or a reed switch; and
the activation portion is configured to control, at least in part, an electrical connection between the power source and the controller when the activation portion is activated.

9. The electrical system of claim 7, wherein the pulse generator is configured to generate an activation signal to activate the switch assembly to provide an electrical connection between the controller and the power source; and
the electrical unit includes an electrical latch connected to the pulse generator and/or the switch assembly.

10. The electrical system of claim 9, wherein, after the pulse generator activates the switch assembly to provide the electrical connection between the controller and the power source, the controller is configured to control the electrical latch to maintain the switch assembly in an activated state.

11. The electrical system of claim 7, wherein, in an inactive state of the switch assembly, the controller does not consume power.

12. The electrical system of claim 7, including a system controller configured to transmit a trigger signal to an antenna of the activation portion to activate the switch assembly.

13. The electrical system of claim 12, including:
a track assembly configured to be fixed to a mounting surface; and
a component configured for selective connection with, movement along and relative to, and removal from the track assembly;
wherein the electrical unit is connected to move with and/or incorporated with the component.

14. The electrical system of claim 13, wherein the component includes one or more safety devices; and the controller is configured to control operation of the one or more safety devices.

15. The electrical system of claim 7, wherein the switch assembly includes a first switch and a second switch.

16. The electrical system of claim 15, wherein the first switch is electrically connected to the power source and the controller; and the second switch is electrically connected to the activation portion and configured to control, at least in part, the first switch.

17. The electrical system of claim 16, wherein the first switch includes a relay and/or a contactor; and the second switch includes a transistor.

18. A method of operating an electrical system comprising an electrical unit including a power source, a switch assembly electrically connected to the power source, an activation portion electrically connected to the switch assembly, an electrical latch electrically connected to the switch assembly, and a controller electrically connected to the switch assembly and the electrical latch, the method comprising:
   activating, via the activation portion, the switch assembly to electrically connect the controller with the power source;
   latching the switch assembly in an activated state via the electrical latch;
   operating the controller to control one or more electrical loads connected to the controller; and
   unlatching, via the controller, the switch assembly to electrically disconnect the controller from the power source.

19. The method of claim 18, wherein activating the activation portion includes activating a pulse generator of the activation portion via (i) providing one or more signals from a system controller to an antenna of the activation portion and (ii) providing the one or more signals from the antenna to the pulse generator.

20. The method of claim 19, wherein the one or more signals from the antenna are sufficient for the pulse generator to utilize to activate the switch assembly; and the pulse generator is not separately connected to the power source or another power source.

* * * * *